United States Patent
Kawai

(10) Patent No.: US 10,820,461 B2
(45) Date of Patent: Oct. 27, 2020

(54) COMPONENT MOUNTING MACHINE

(71) Applicant: FUJI CORPORATION, Chiryu-shi (JP)

(72) Inventor: Hidetoshi Kawai, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 296 days.

(21) Appl. No.: 15/742,914

(22) PCT Filed: Jul. 17, 2015

(86) PCT No.: PCT/JP2015/070512
§ 371 (c)(1),
(2) Date: Jan. 9, 2018

(87) PCT Pub. No.: WO2017/013703
PCT Pub. Date: Jan. 26, 2017

(65) Prior Publication Data
US 2018/0368298 A1 Dec. 20, 2018

(51) Int. Cl.
*H05K 13/08* (2006.01)
*H05K 13/04* (2006.01)
(Continued)

(52) U.S. Cl.
CPC ....... *H05K 13/087* (2018.08); *G06K 7/10722* (2013.01); *G06K 7/1413* (2013.01);
(Continued)

(58) Field of Classification Search
CPC ............... H05K 13/087; H05K 13/081; H05K 13/0812; H05K 13/0409
See application file for complete search history.

(56) References Cited

FOREIGN PATENT DOCUMENTS

| JP | 4-334099 A | 11/1992 |
|----|-----------|---------|
| JP | 2004-311599 A | 11/2004 |

(Continued)

OTHER PUBLICATIONS

International Search Report dated Oct. 20, 2015 in PCT/JP2015/070512 filed Jul. 17, 2015.
(Continued)

*Primary Examiner* — Livius R. Cazan
(74) *Attorney, Agent, or Firm* — Oblon, McClelland, Maier & Neustadt, L.L.P.

(57) ABSTRACT

In a component mounting machine, before the suction nozzle held by the rotary head is automatically exchanged, the nozzle ID codes of all suction nozzles arranged on the nozzle station are continuously read at a high speed and stored in association with the position of each suction nozzle. Sequentially imaging the nozzle ID code display section of each suction nozzle of each column is performed without stopping the mark imaging camera while moving the camera in an arrangement direction of the suction nozzle of each column of the nozzle station. The movement direction of the camera is reversed each time the last imaging operation of one column is completed and the camera is moved to imaging an adjacent column and the nozzle ID code of each suction nozzle of each column read at the image processing is stored in the storage in association with the position of each suction nozzle.

6 Claims, 10 Drawing Sheets

(51) Int. Cl.
*G06K 7/10* (2006.01)
*G06K 7/14* (2006.01)

(52) U.S. Cl.
CPC ....... *G06K 7/1417* (2013.01); *H05K 13/0409* (2018.08); *H05K 13/081* (2018.08); *H05K 13/0812* (2018.08)

(56) References Cited

FOREIGN PATENT DOCUMENTS

| | | | |
|---|---|---|---|
| JP | 2004311599 A | * | 11/2004 |
| JP | 2008-135431 A | | 6/2008 |
| JP | 2008135431 A | * | 6/2008 |
| JP | 2009-117733 A | | 5/2009 |
| JP | 2009117733 A | * | 5/2009 |
| JP | 2009-182280 A | | 8/2009 |
| JP | 4567801 B2 | | 10/2010 |

OTHER PUBLICATIONS

Extended European Search Report dated Jun. 11, 2018 in Patent Application No. 15898865.9, 16 pages.

* cited by examiner

WHEN SHUTTER PLATE IS CLOSED

WHEN SHUTTER PLATE IS OPENED

WHEN SHUTTER PLATE IS CLOSED

COMPONENT MOUNTING MACHINE

TECHNICAL FIELD

The present invention relates to a component mounting machine which is installed a function of automatically exchanging suction nozzles held by a mounting head with suction nozzles arranged on a nozzle station.

BACKGROUND ART

In a component mounting machine, as described in PTL 1 (Japanese Patent No. 4567801), a suction nozzle for exchanging is arranged on a nozzle station installed in a component mounting machine and thus a suction nozzle held by a mounting head is automatically exchanged with the suction nozzle on the nozzle station.

However, since a work of changing the suction nozzle on the nozzle station is performed manually by an operator, there is a possibility that wrong types of suction nozzles are arranged on the nozzle station due to artificial operation mistake. As a countermeasure against this, in PTL 1, an identification mark for identifying the type of the suction nozzle is provided on an upper face of a flange of the suction nozzle, the identification mark of the suction nozzle to be exchanged on the nozzle station is imaged by the camera before the suction nozzle held by the mounting head is automatically exchanged, the image is processed to check the type of suction nozzle, and then the suction nozzle held by the mounting head is automatically exchanged.

CITATION LIST

Patent Literature

PTL 1: Japanese Patent No. 4567801

SUMMARY OF INVENTION

Technical Problem

However, in PTL 1 described above, since the suction nozzle is exchanged after the identification mark of the suction nozzle on the nozzle station is imaged for each suction nozzle to be exchanged and the type of suction nozzle is checked, the suction nozzles cannot be efficiently exchanged in a case where multiple suction nozzles held by the mounting head are continuously exchanged. Particularly, in recent component mounting machines, since the number of suction nozzles to be held by one mounting head tends to increase due to miniaturization of the suction nozzle according to miniaturization of the components to be mounted on a circuit board, there is a tendency that the number of suction nozzles to be exchanged at the time of production change increases and the time required for exchange of the suction nozzle becomes longer, and thus there is a disadvantage that an operating rate of the component mounting machine decreases.

Therefore, the problem to be solved by the present invention is to provide a component mounting machine which can shorten the time required to recognize images of types of multiple suction nozzles arranged on the nozzle station and can continuously and efficiently exchange the multiple suction nozzle held by a mounting head.

Solution to Problem

In order to solve the above problem, according to the invention, there is provided a component mounting machine including: a nozzle station in which multiple suction nozzles for exchanging with a suction nozzle held by a mounting head are arranged in multiple columns; a camera which images a fiducial mark of a circuit board on which a component is mounted; and control means for controlling a nozzle exchange operation of moving the mounting head and the camera above the nozzle station and exchanging the suction nozzles held by the mounting head with the suction nozzles of the nozzle station, in which a nozzle ID code display section in which a code of identification information of the suction nozzle (hereinafter, referred to as "nozzle ID code") is displayed at a position at which imaging can be performed by the camera from above is provided in the suction nozzle, in which the control means controls an operation of imaging the nozzle ID code display section of each suction nozzle in each column of the nozzle station by the camera and an image processing operation of processing the image of the nozzle ID code display section imaged by the camera and reading the nozzle ID code, and in which, in a case where the nozzle ID code of each suction nozzle in each column of the nozzle station is read, the control means performs an operation of sequentially imaging the nozzle ID code display sections of each suction nozzle in each column without stopping the camera while moving the camera along an arrangement direction of the suction nozzle of each column, reverses the movement direction of the camera each time the last imaging operation of one column is completed and the camera is moved for an imaging operation of an adjacent column, and stores the nozzle ID code of each suction nozzle in each column read in the image processing operation in storage means in association with a position of each suction nozzle.

In short, the invention is a technical idea in which the nozzle ID codes of all the suction nozzles arranged on the nozzle station are continuously read at high speed and are stored in association with the position of each suction nozzle and specifically an operation (so-called on-the-fly imaging) of sequentially imaging the nozzle ID code display sections of each suction nozzle in each column is performed without stopping the camera while moving the camera in an arrangement direction of the suction nozzle of each column of the nozzle station, the movement direction of the camera is reversed each time the last imaging operation of one column is completed and the camera is moved to an imaging operation of an adjacent column, and the nozzle ID code of each suction nozzle in each column read at the image processing operation is stored in the storage means in association with a position of each suction nozzle. Accordingly, the time required to recognize images of the nozzle ID codes of all the suction nozzles arranged on the nozzle station can be shortened and the multiple suction nozzles held by the mounting head can be continuously and efficiently exchanged.

In a case where the suction nozzles are arranged in a lattice point shape on the nozzle station, the on-the-fly imaging can be performed by moving the camera in either of the arrangement direction of the suction nozzle in a direction along a long side and a direction along a short side of the nozzle station. Even in a case where the camera is moved in either of the long side and the short side of the nozzle station, although it is necessary to temporarily stop the movement of the camera and to reverse the movement direction thereof each time the last imaging operation of one column is completed, the time to complete the imaging operation of all the columns becomes longer as the number of stop of the camera increases.

In the invention, in a case where of imaging the nozzle ID code display section of each suction nozzle in each column of the nozzle station, the camera may be moved in a direction along a long side of the nozzle station as the arrangement direction of the suction nozzles in each column. In this way, compared with a case of moving the camera in the direction along the short side of the nozzle station, the number of stop of the camera can be reduced and the time until the imaging operations of all the columns are completed can be shortened.

In addition, in the invention, in a case where there is a suction nozzle whose nozzle ID code is failed to be read during the operation of imaging the nozzle ID code display section of each suction nozzle in each column of the nozzle station, the position of the suction nozzle whose nozzle ID code is failed to be read may be stored in the storage means, the imaging of the nozzle ID code display sections of all the suction nozzles of the nozzle station may be completed, the camera may be moved above the suction nozzle whose nozzle ID code is failed to be read based on the stored information in the storage means to change the imaging condition, and then imaging and image processing of the nozzle ID code display section of the suction nozzle may be performed again. In this way, it is not necessary to stop the movement of the camera during the operation of imaging the nozzle ID code display section of each suction nozzle in each column, and extension of the time to complete the imaging operation of all the columns can be prevented.

At this time, in a case where there are two or more suction nozzles whose nozzle ID codes are failed to be read, the camera may be moved in the order of the suction nozzle closest to the current position of the camera among the two or more suction nozzles so as to performs imaging and image processing of the nozzle ID code display section of the suction nozzle may be performed again. In this way, it is possible to also efficiently re-read the nozzle ID code of the suction nozzle whose nozzle ID code is failed to be read.

Further, the camera may be stopped in a case of imaging the nozzle ID code display section of the suction nozzle whose nozzle ID code is failed to be read. In this way, it is possible to acquire the image of the nozzle ID code display section of the suction nozzle whose nozzle ID code is failed to be read with a clearer image, and it is possible to increase a reading success rate of the nozzle ID code.

Alternatively, lighting conditions (for example, wavelength, light exposure time, or the like) of the light source may be changed in a case of imaging the nozzle ID code display section of the suction nozzle whose nozzle ID code is failed to be read. In short, if the lighting conditions of the light source are changed so that a clearer image is obtained than at the time of the first imaging, the reading success rate of the nozzle ID code can further increase.

Since a work of changing the suction nozzle at the nozzle station is performed manually by the operator, if the nozzle station is configured to be exchangeable, even when the component mounting machine is in operation, at a work space with a margin outside the component mounting machine, it is convenient since the operator can perform the work of changing the suction nozzle at the nozzle station with a time margin and prepare for the next nozzle station exchange. However, when the nozzle stations are configured to be exchangeable, since inclination or positional deviation of the nozzle stations installed in the component mounting machine is likely to be generated, when the nozzle ID code is read while an inclination angle or a positional deviation amount of the nozzle station is unknown, there is a possibility that the nozzle ID code display section protrudes from the visual field of the camera and thus reading of the nozzle ID code fails.

As a countermeasure against this, station fiducial marks are provided at at least two positions on the upper face side of the nozzle station, and before the nozzle ID code of each suction nozzle in each column of the nozzle station is read, the control means may cause the camera to image the station fiducial marks of at least two positions provided on the nozzle station, recognize images of the positions of the station fiducial marks of at least two positions, and calculate the position of each suction nozzle in each column of the nozzle station based on positions of the station fiducial marks of at least two positions. In this way, even if there is an inclination or an positional deviation of the nozzle station installed in the component mounting machine, the position of each suction nozzle in each column of the nozzle station can be calculated with high accuracy based on the position of station fiducial marks of at least two positions of the nozzle station, the nozzle ID code display section of each suction nozzle can be reliably imaged within the visual field of the camera, and reading failure of the nozzle ID code due to the inclination or the positional deviation of the nozzle station can be prevented.

DESCRIPTION OF EMBODIMENTS

Hereinafter, an example in which a mode for carrying out the invention is applied to a rotary head type component mounting machine and is specified will be described.

Figure 1:
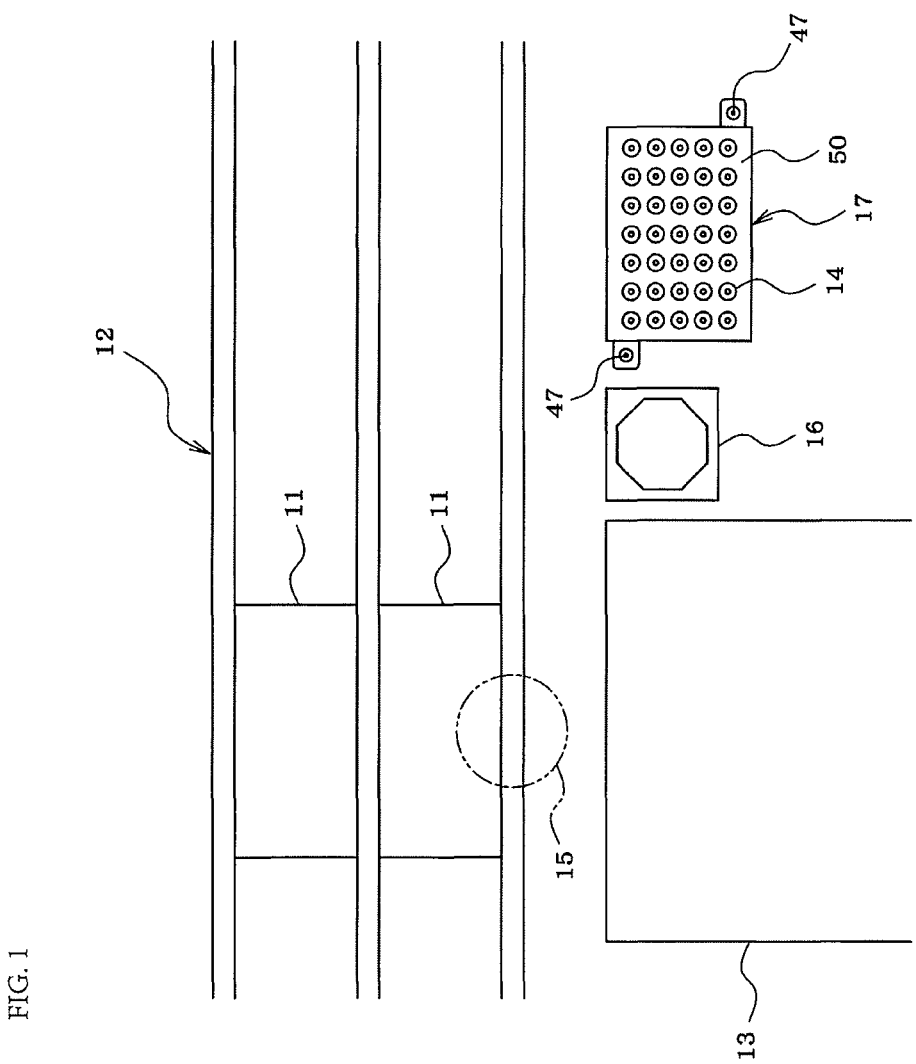
FIG. 1 is a plan view of a main portion of a rotary head type component mounting machine illustrating one embodiment of the invention.
Figure 2:
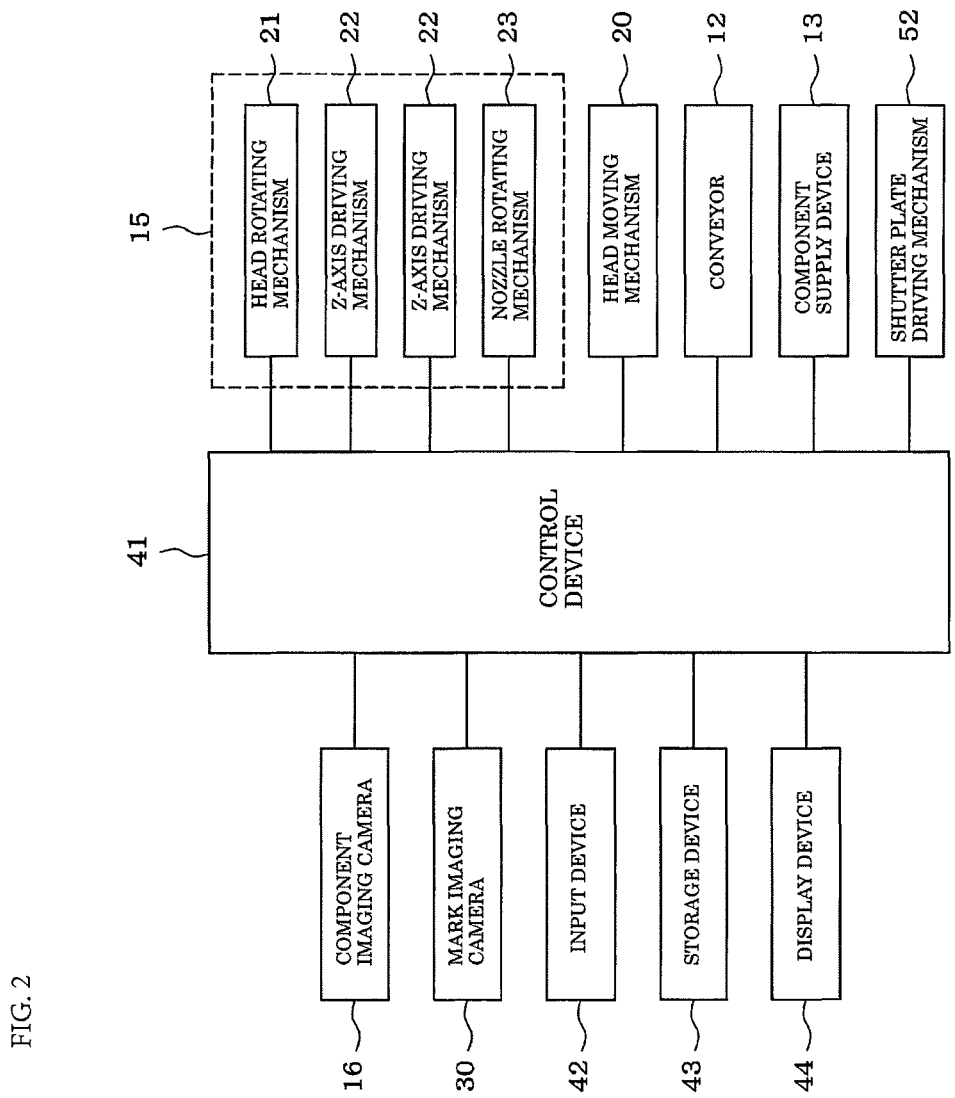
FIG. 2 is a block diagram illustrating a configuration of a control system of the component mounting machine.

First, configuration of the rotary head type component mounting machine will be described with reference to FIG. 1 and FIG. 2. The rotary head type component mounting machine is configured to include a conveyor 12 that conveys a circuit board 11, a component supply device 13 such as a tape feeder and a tray feeder, a rotary head 15 (rotation type mounting head) that sucks a component supplied by the component supply device 13 using a suction nozzle 14 (see FIG. 3 to FIG. 5) and mounts the component on the circuit board 11, a component imaging camera 16 that images the component sucked by the suction nozzle 14 from a lower face side thereof, a nozzle station 17 in which multiple suction nozzles 14 are arranged in multiple columns so as to exchange with the suction nozzles 14 held by the rotary head 15, or the like.

The component mounting machine includes a head moving mechanism 20 (see FIG. 2) which moves the rotary head 15 in XY-directions between a component suction area which performs a component suction operation, a component imaging area which images the component sucked by the suction nozzle 14 using the component imaging camera 16, a component mounting area which performs a component mounting action, and a nozzle exchange area which performs the exchange operation of the suction nozzle 14.

Figure 3:
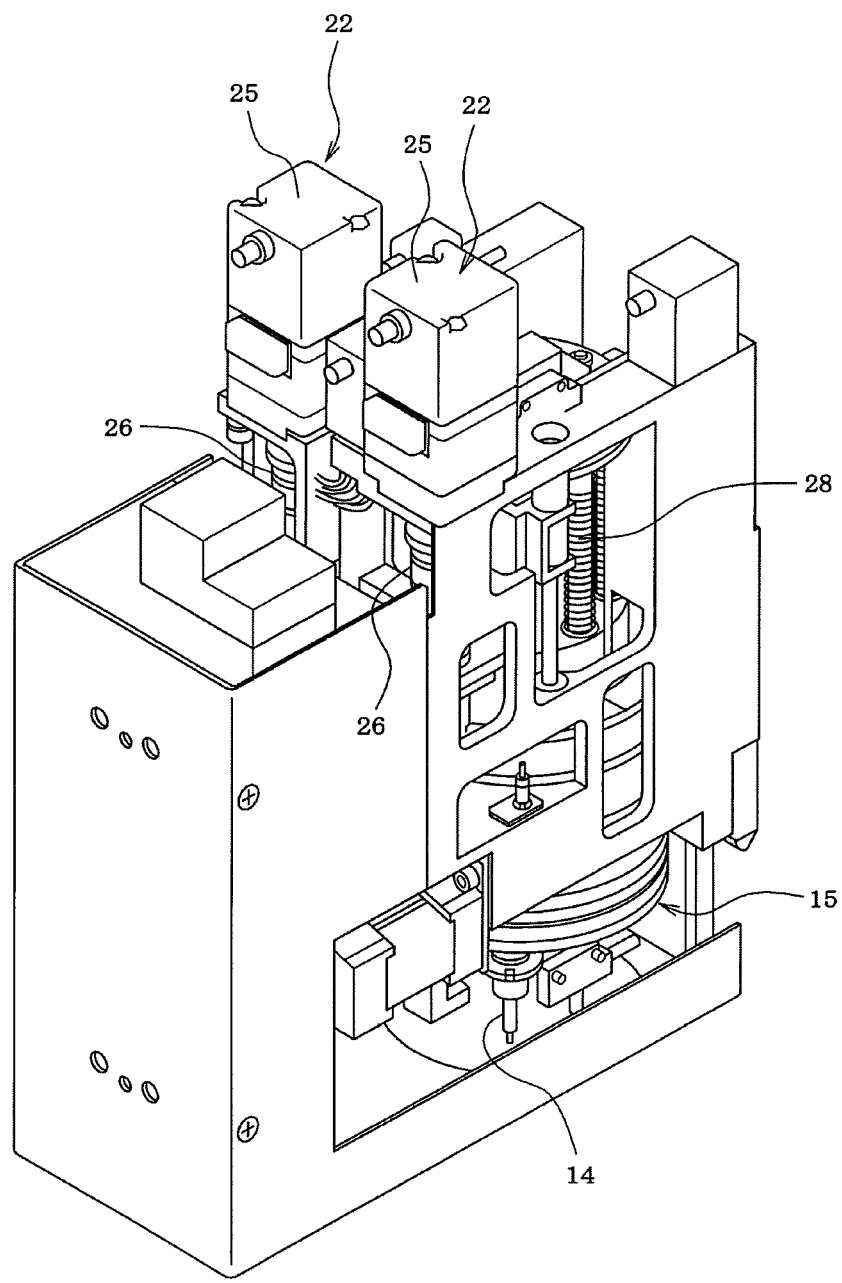
FIG. 3 is a perspective view of the entire rotary head as seen obliquely from above.
Figure 4:
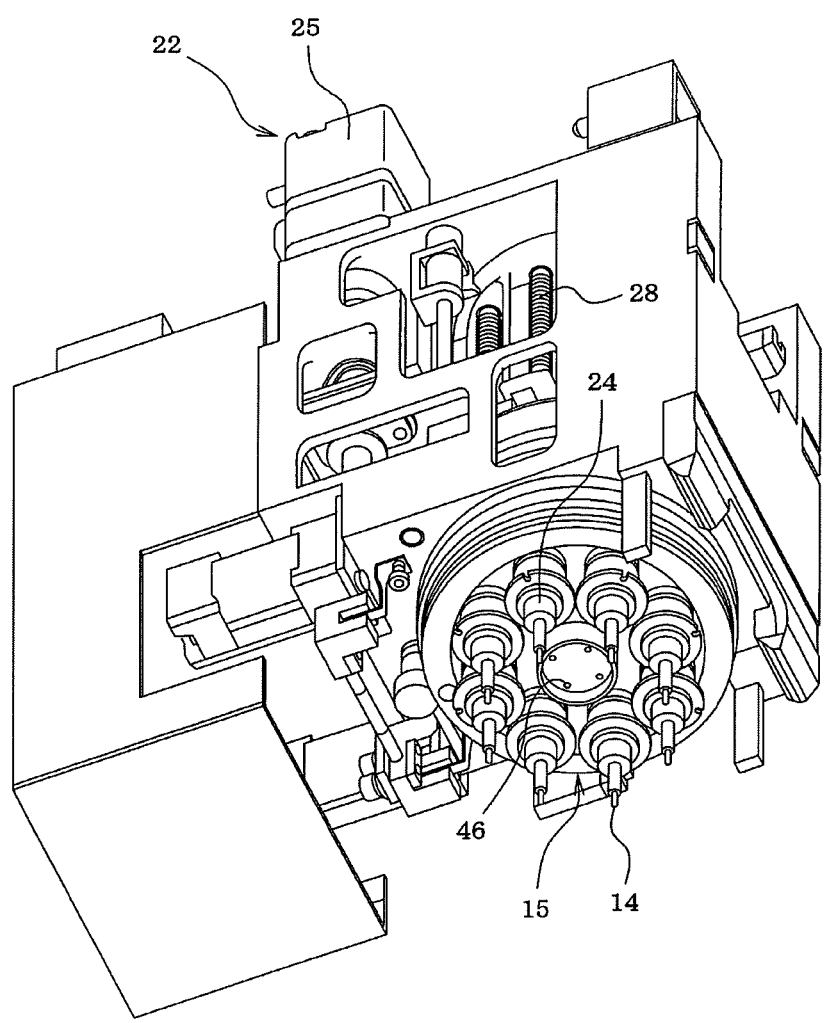
FIG. 4 is a perspective view of the entire rotary head as seen obliquely from below.

As illustrated in FIG. 3 and FIG. 4, in the rotary head 15, multiple suction nozzles 14 which suck components sent to the component suction position by the component supply device 13 is held to be exchangeable to a predetermined nozzle pitch in a circumferential direction. Further, as illustrated in FIG. 2, the rotary head 15 is provided with a head rotating mechanism 21 which pivots the multiple suction nozzles 14 in a circumferential direction of the rotary head 15 by rotating (revolving) the rotary head 15 about an axial center line (R-axis), a Z-axis driving mechanism 22 which sucks the components by the suction nozzle 14 by lowering the suction nozzle 14 at a predetermined stopping position (above component suction position) of a pivoting track of the suction nozzle 14, and a nozzle rotating mechanism 23 which rotates (revolving) the suction nozzle 14 about axial center line and corrects the direction of the component sucked by the suction nozzle 14.

In this embodiment, although the Z-axis driving mechanism 22 is provided at two positions around the rotary head 15, the Z-axis driving mechanism 22 may be provided only at one position. In a case where the Z-axis driving mechanism 22 is provided at two positions, the Z-axis driving mechanism 22 may be actuated one by one, two Z-axis driving mechanisms 22 may be operated at the same time, two suction nozzles 14 may be simultaneously lowered, and then two components are simultaneously sucked by the two suction nozzles 14 or may be exchanged simultaneously with the two suction nozzles 14 of the nozzle station 17.

As illustrated in FIG. 3 and FIG. 4, the Z-axis driving mechanism 22 uses a Z-axis motor 25 as an actuator, and moves up and down the suction nozzle 14 held to be exchangeable to a lower portion of a nozzle holder 28 by rotating a feeding screw 26 by the Z-axis motor 25 and moving a Z-axis slide (not illustrated) in an up-down direction and by engaging the Z-axis slide with an engagement piece (not illustrated) provided on an upper end of the nozzle holder 28 of the rotary head 15 and moving the nozzle holder 28 in the up-down direction. The Z-axis slide may be moved in the up-down direction by using a linear motor as the Z-axis motor 25. Alternatively, a linear solenoid, an air cylinder, or the like may be used in place of the linear motor.

On the other hand, a mark imaging camera 30 (see FIG. 2) which moves integrally with the rotary head 15 by the head moving mechanism 20 to image the fiducial mark of the circuit board 11 from above is provided to the component mounting machine.

An input device 42 such as a keyboard, a mouse, a touch panel, or the like, a storage device 43 (storage means) such as a hard disk, a RAM, a ROM or the like for storing various programs and data, a display device 44 such as a liquid crystal display and a CRT, and the like are connected to the control device 41 (control means) of the component mounting machine.

During the operation (during production) of the component mounting machine, operations are repeated in which the rotary head 15 is moved to the component suction area by the head moving mechanism 20, the component suction operation is performed, the rotary head 15 is moved to the component imaging area, the component sucked by the suction nozzle 14 is imaged from the lower face side by the component imaging camera 16, a suction posture and the deviation amount of the suction position and angle of the component is recognized, the rotary head 15 is moved to the component mounting area, deviation of the suction position and angle is corrected, and a component mounting action is performed in which the component is mounted on the circuit board 11.

As illustrated in FIG. 4, on the lower face side of the rotary head 15, head fiducial marks 46 are provided at equal intervals at four positions (at least two positions) concentric with the rotation center thereof. The control device 41 of the component mounting machine detects, position (XY-coordinates of center point) and the inclination angle ($\theta$) of the rotary head 15 based on the positions of the four head fiducial mark 46 by imaging the four head fiducial marks 46 on the lower face of the rotary head 15 by the component imaging camera 16 and recognizing the image of the positions of the four head fiducial mark 46. In this way, since the deviation of the position and the inclination angle of the rotary head 17 can be detected, the positional correction amount and the inclination angle correction amount of the rotary head 17 can be accurately obtained and even in a case where the position and the inclination angle of the rotary head 17 deviate, it is possible to accurately position the position of the suction nozzle 14 held by the rotary head 17 above the suction nozzle 14 of the nozzle station 17 by correcting the deviation.

Figure 8:
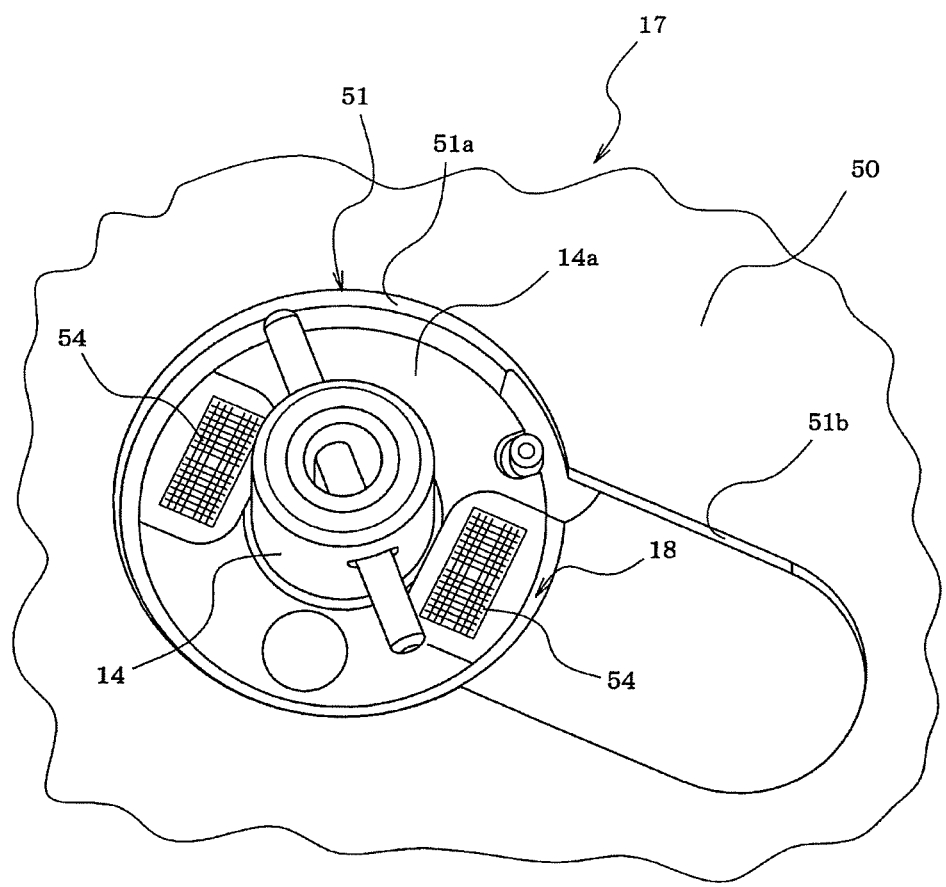
FIG. 8 is an enlarged perspective view illustrating a positional relationship between a gourd-shaped hole of the nozzle station and the suction nozzle when the shutter plate is opened.
Figure 9:
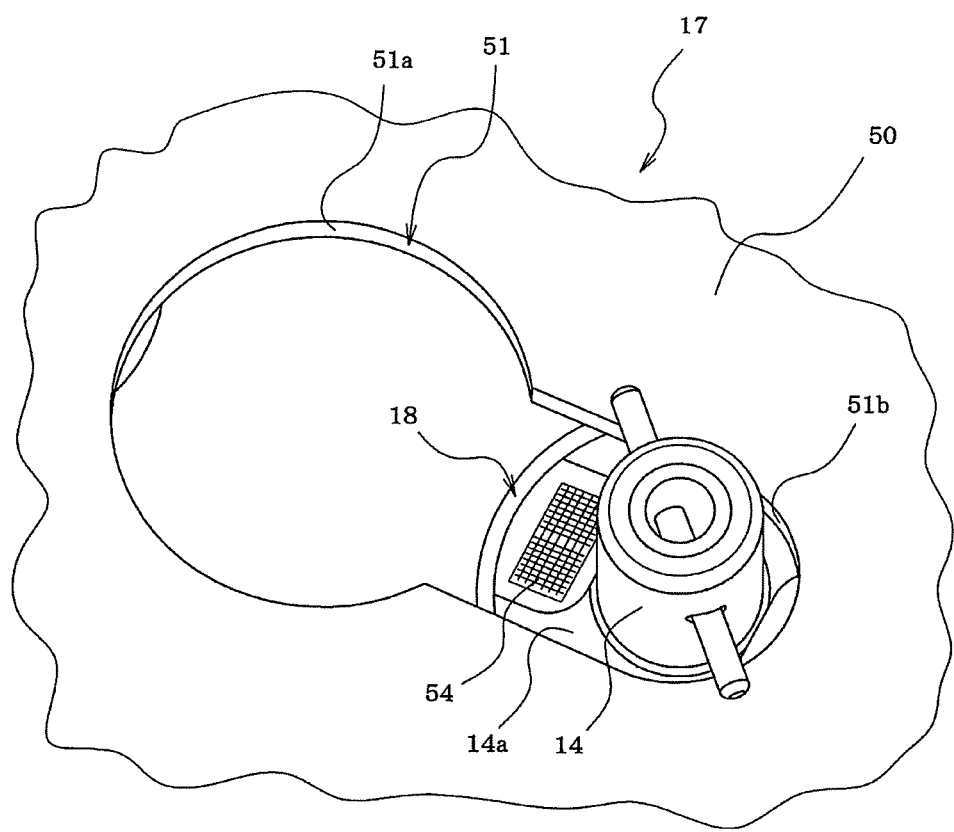
FIG. 9 is an enlarged perspective view illustrating a positional relationship between the gourd-shaped hole of the nozzle station and the suction nozzle when the shutter plate is closed.

On the other hand, the nozzle station 17 is installed to be exchangeable within the movement range of the rotary head 15 in the component mounting machine. As illustrated in FIG. 6 to FIG. 9, on the nozzle station 17, multiple nozzle accommodation recessed sections 18 which accommodate the suction nozzle 14 are formed in multiple columns in lattice points at a predetermined pitch. In addition, a shutter plate 50 which prevents the suction nozzle 14 from falling off during the exchange work of the nozzle station 17 is attached to the upper face of the nozzle station 17 so as to be slidable in a direction along the long side of the nozzle station 17. On the shutter plate 50, a gourd-shaped hole 51 is respectively formed to extend in the sliding direction of the shutter plate 50 at positions corresponding to the suction nozzles 14 (nozzle accommodation recessed sections 18) arranged in multiple columns on the nozzle station 17 and in a state where the shutter plate 50 is slid to the open position illustrated in FIG. 6, as illustrated in FIG. 8, a hole 51a having a diameter larger than a diameter of a flange section 14a of the suction nozzle 14 in the gourd-shaped holes 51 faces the flange section 14a of the suction nozzle 14 so that the suction nozzle 14 is brought into a state of being taken out from the nozzle accommodation recessed section 18. On the other hand, in a state where the shutter plate 50 is slid to the closed position illustrated in FIG. 7, as illustrated in FIG. 9, a hole 51b having a diameter smaller than the diameter of the flange section 14a of the suction nozzle 14 in the gourd-shaped holes 51 faces the flange section 14a of the suction nozzle 14 so that the flange section 14a of the suction nozzle 14 is brought into a state of being prevented from coming out by the shutter plate 50 and falling off of the suction nozzle 14 from the nozzle accommodation recessed section 18 is prevented.

Figure 6:
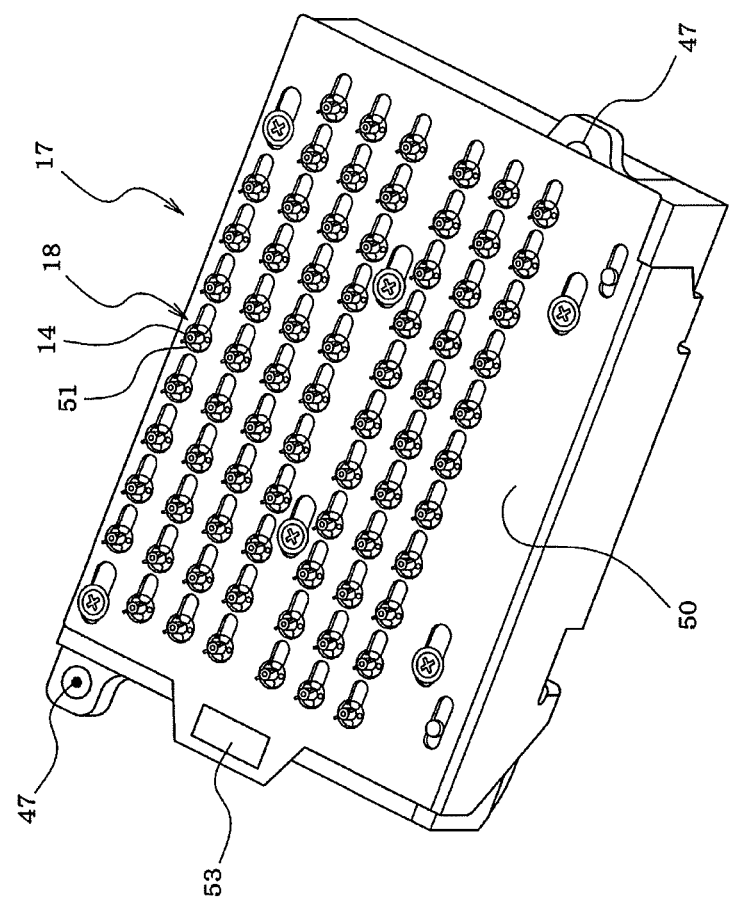
FIG. 6 is a perspective view illustrating a state of a nozzle station when a shutter plate is opened.
Figure 7:
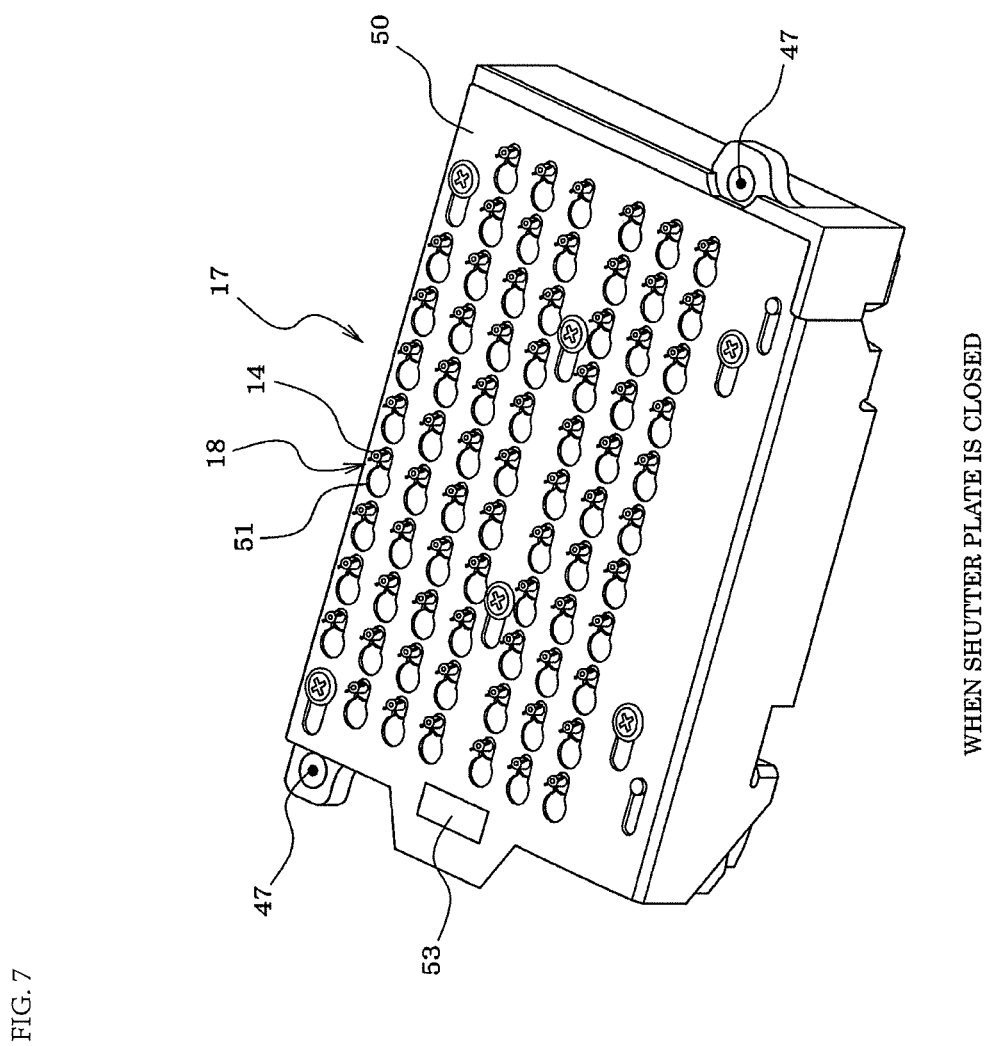
FIG. 7 is a perspective view illustrating a state of the nozzle station when the shutter plate is closed.

A shutter plate driving mechanism 52 (see FIG. 2) which drives the shutter plate 50 to be opened and closed is provided on the nozzle station 17, while the component mounting machine is in operation, the shutter plate 50 is held in a state of being automatically slid at an opened position illustrated in FIG. 6 by the shutter plate driving mechanism 52 and when component mounting machine is powered off, when the nozzle station 17 is exchanged, and the like, the shutter plate 50 is held in a state of being automatically slid at a closed position illustrated in FIG. 7 by a return spring (not illustrated) of the shutter plate driving mechanism 52 or the like.

As illustrated in FIG. 6 and FIG. 7, station fiducial marks 47 are provided at two positions in the diagonal direction on the upper face side of the nozzle station 17 so as to be exposed at least when the shutter plate 50 is closed. When the shutter plate 50 is closed, the control device 41 of the component mounting machine images two positions of the station fiducial marks 47 of the nozzle station 17 from above by the mark imaging camera 30, and positions of the two positions of station fiducial marks 47 is recognized as images, the position (XY-coordinates of the center point) and the inclination angle (θ) of the nozzle station 17 are calculated based on the positions of the two positions of the station fiducial marks 47, and by using the calculated value, position (position of each nozzle accommodation recessed section 18) of each suction nozzle 14 of each column of the nozzle stations 17 is calculated. The station fiducial mark 47 may be provided at three or more positions.

Further, as illustrated in FIG. 6 and FIG. 7, in the empty space on the upper face of the nozzle station 17 (for example, upper face of shutter plate 50), the station ID code display section 53 in which a one-dimensional code or two-dimensional code (hereinafter referred to as "station ID code") of identification information of the nozzle station 17 is provided at a position at which imaging can be performed by the mark imaging camera 30. The control device 41 of the component mounting machine images the station ID code display section 53 of the nozzle station 17 by the mark imaging camera 30 from above, reads the station ID code by processing the image, identifies the type of the nozzle station 17 or the like from the station ID code, acquires the registration information of the position of each nozzle accommodation recessed section 18 of the nozzle station 17 (position of the suction nozzle 14 accommodated in each nozzle accommodation recessed section 18), and thereafter, the position of each suction nozzle 14 in each column of the nozzle station 17 is obtained by correcting the registration information with reference to the positions the two positions of the station fiducial marks 47 identified by the operations described above.

Figure 5:
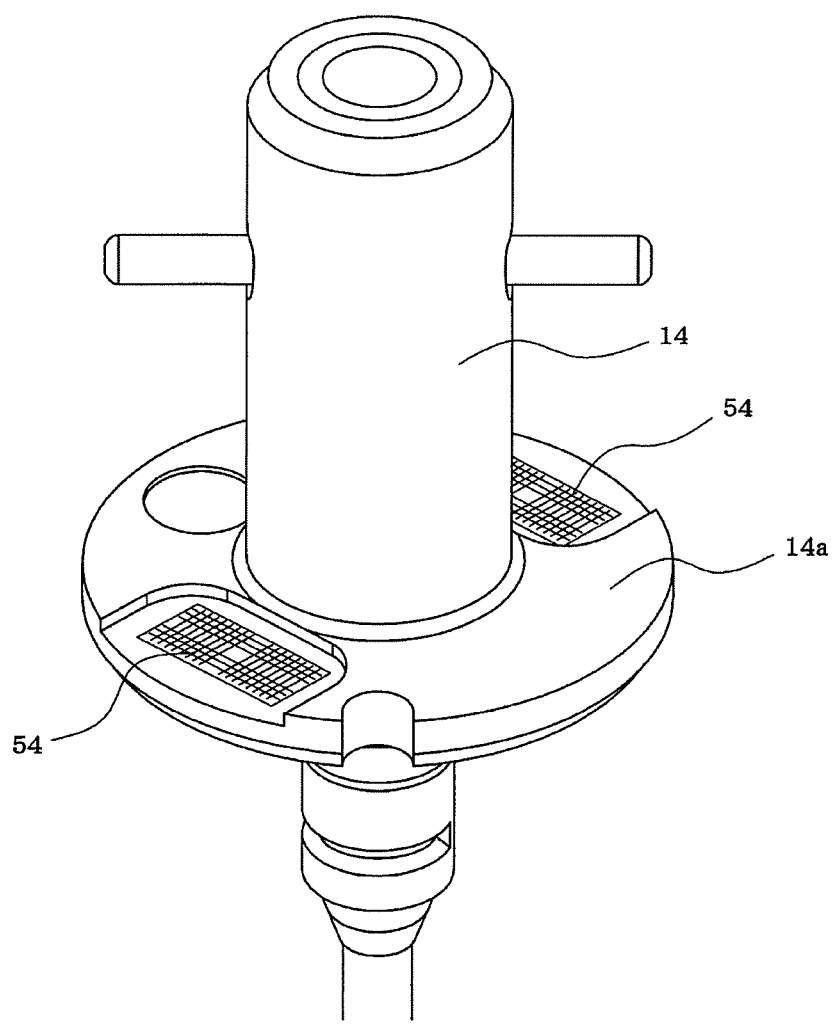
FIG. 5 is a partially enlarged perspective view of a suction nozzle.

In addition, as illustrated in FIG. 5 and FIG. 8, a nozzle ID code display section 54 that displays a one-dimensional code or two-dimensional code (hereinafter, referred to as "nozzle ID code") of the identification information of the suction nozzle 14 is provided at one or multiple positions on the upper face of the flange section 14*a* of the suction nozzle 14 (position at which imaging can be performed by mark imaging camera 30). Before the rotary head 15 is moved to the nozzle exchange area by the head moving mechanism 20 to perform automatic exchange of the suction nozzle 14, the control device 41 of the component mounting machine images the nozzle ID code display section 54 of each suction nozzle 14 of each column of the nozzle station 17 by the mark imaging camera 30, reads the nozzle ID code of each suction nozzle 14 by the image processing, the nozzle ID code of each suction nozzle 14 stores in the storage device 43 in association with the position of each suction nozzle 14, after that, when the suction nozzle 14 held on the rotary head 15 is automatically exchanged, the suction nozzle 14 is automatically exchanged after the type of each suction nozzle 14 in each column of the nozzle station 17 is checked based on stored information in the storage device 43.

At this time, the control device 41 of the component mounting machine automatically exchanges the suction nozzles 14 held by the rotary head 15 after reading the nozzle ID codes of all the suction nozzles 14 arranged on the nozzle station 17, the time to read the nozzle ID code may be any time as long as it is before the suction nozzle 14 is automatically exchanged, and for example, during the period from the time the power to the component mounting machine is turned on to the time before the start of production or during production stop after the exchange of the nozzle station 17 (the period during which the component suction and mounting operation is stopped), the nozzle ID code may be read, in short, the nozzle ID code may be read without stopping production (component suction and mounting operation) as much as possible.

Figure 10:
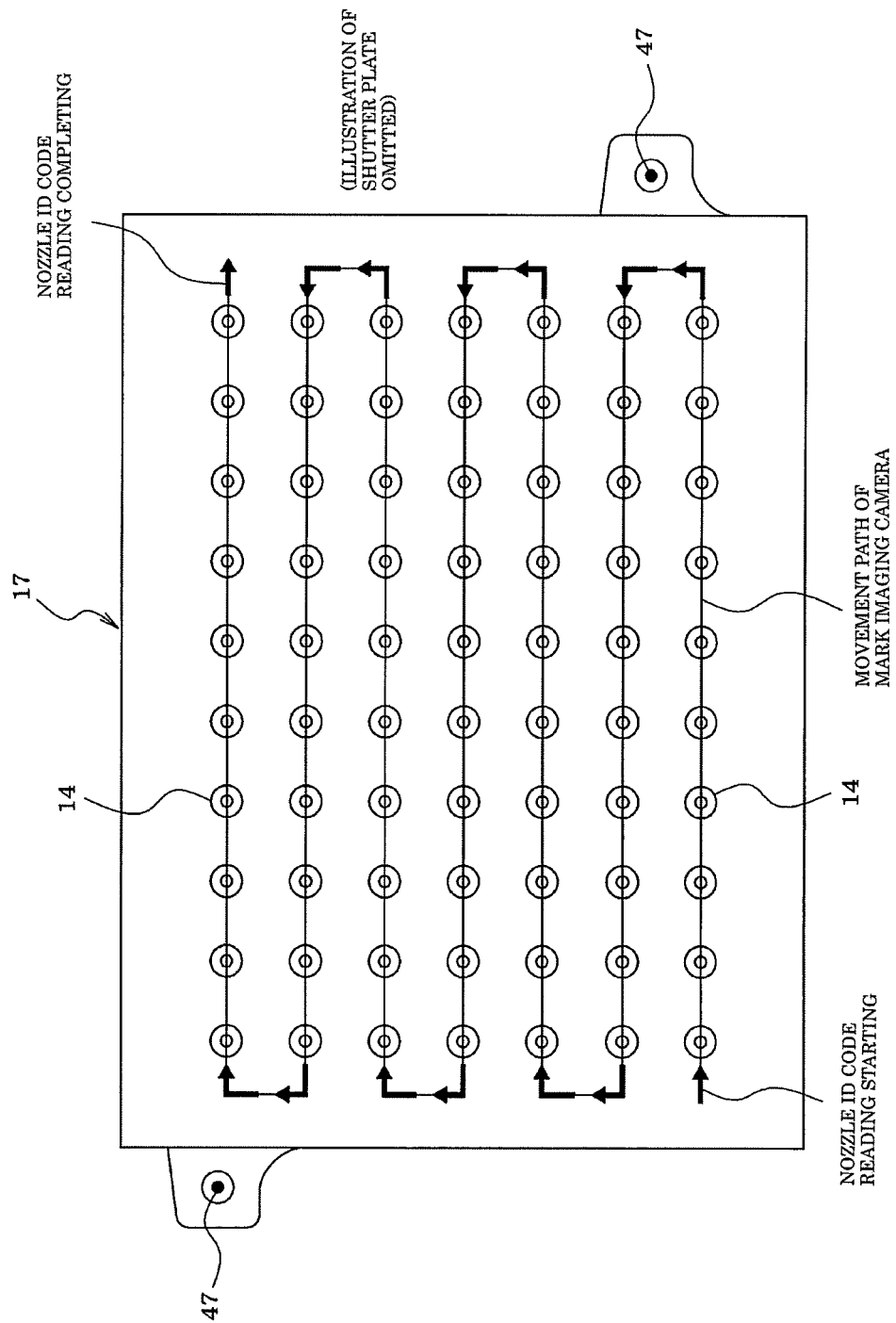
FIG. 10 is a plan view for explaining a movement path of a mark imaging camera when a nozzle ID code is read.

In addition, in order to continuously read the nozzle ID codes of all the suction nozzles 14 arranged on the nozzle station 17 at high speed, as illustrated in FIG. 10, the control device 41 of the component mounting machine performs an operation (so-called on-the-fly imaging) in which the nozzle ID code display section 54 of each suction nozzle 14 in each column is sequentially imaged while the mark imaging cameras 30 is moved at a predetermined speed along the arrangement direction of the suction nozzles 14 in each column of the nozzle station 17 without stopping the mark imaging camera 30, reverses the movement direction of the mark imaging camera 30 each time the last imaging operation of one column is completed and the mark imaging camera is moved to the imaging operation of the next column, and stores the nozzle ID codes of the suction nozzles 14 in each column read at the image processing operation in the storage device 43 in association with the positions of each suction nozzles 14.

As illustrated in FIG. 10, in a case where the suction nozzles 14 are arranged in a lattice points on the nozzle station 17, the on-the-fly imaging can be performed by moving the mark imaging camera 30 in either of the arrangement direction of the suction nozzle 14 in a direction along a long side and a direction along the short side of the nozzle station 17. Even in a case where the mark imaging camera 30 is moved in either of the long side and the short side of the nozzle station 17, although it is necessary to temporarily stop the movement of the mark imaging camera 30 and to reverse the movement direction thereof each time the last imaging operation of one column is completed, the time to complete the imaging operation of all the columns becomes longer as the number of stop of the mark imaging camera 30 increases.

In this embodiment, in a case where the control device 41 of the component mounting machine reads the nozzle ID code of each suction nozzle 14 in each column of the nozzle station 17, the control device 41 thereof causes the mark imaging camera 30 to move to the direction along the long side of the nozzle station 17 as the arrangement direction of the suction nozzles 14. In this way, compared with a case of moving the mark imaging camera 30 in the direction along the short side of the nozzle station 17, the number of stop of the mark imaging camera 30 can be reduced and the time until the imaging operations of all the columns are completed can be shortened.

In addition, in a case where there is a suction nozzle 14 whose nozzle ID code is failed to be read during the operation of imaging the nozzle ID code display section 54 of each suction nozzle 14 in each column of the nozzle station 17, the control device 41 of the component mounting machine can store the position of the suction nozzle 14 whose nozzle ID code is failed to be read in the storage device 43, completes the image of the nozzle ID code display section 54 of all the suction nozzles 14 of the nozzle station 17, causes the mark imaging camera 30 to move above the suction nozzle 14 whose nozzle ID code is failed to be read based on the stored information in the storage device 43 to change the imaging condition, and then can perform again imaging and image processing of the nozzle ID code display section 54 of the suction nozzle 14.

In this way, it is not necessary to stop the movement of the mark imaging camera 30 during the operation of imaging the nozzle ID code display section 54 of each suction nozzle 14 of each column, and extension of the time to complete the imaging operation of all the columns can be prevented. Re-reading of the nozzle ID code may be performed by on-the-fly imaging or the mark imaging camera 30 may also be stopped above the suction nozzle 14 for re-reading the nozzle ID code so as to image the nozzle ID code display section 54. In a case where re-reading of the nozzle ID code is performed by on-the-fly imaging, the imaging condition may be changed so as to obtain a clearer image than that at the time of the first imaging such as making the illumination brighter than the first imaging or lowering the movement speed of the mark imaging camera 30. Likewise, if the re-reading of the nozzle ID code is performed by stopping the mark imaging camera 30, a clearer image is obtained than that in the first imaging, and the reading success rate of the nozzle ID code can be increased. In addition, if the lighting conditions (for example, wavelength, light exposure time, or the like) of the light source is changed so as to obtain clearer images than at the time of the first imaging, the reading success rate of the nozzle ID code can be further enhanced.

At this time, in a case where there are two or more suction nozzles 14 whose nozzle ID codes are failed to be read, the control device 41 of the component mounting machine causes the mark imaging camera 30 to move in the order of the suction nozzles 14 close to the current position of the mark imaging camera 30 of the two or more suction nozzles 14 and thus performs again imaging and image processing of the nozzle ID code display section 54 of the suction nozzle 14. In this way, it is possible to also efficiently re-read the nozzle ID code of the suction nozzle 14 whose nozzle ID code is failed to be read.

Since A work of changing the suction nozzle 14 on the nozzle station 17 is performed manually by the operator, if the nozzle station 17 is configured to be exchangeable, even when the component mounting machine is in operation, at a work space with the margin outside the component mounting machine, it is convenient since the operator can perform the work of changing the suction nozzle 14 at the nozzle station 17 with a time margin and prepare for the next nozzle station 17 exchange. However, when the nozzle stations 17 are configured to be exchangeable, since inclination or positional deviation of the nozzle stations 17 installed in the component mounting machine is likely to be generated, when the nozzle ID code of the suction nozzle 14 is read while an inclination angle or a positional deviation amount of the nozzle station 17 is unknown, there is a possibility that the nozzle ID code display section 54 protrudes from the visual field of the mark imaging camera 30 and thus reading of the nozzle ID code fails.

As a countermeasure against this, station fiducial marks 47 are provided at at least two positions on the upper face side of the exchangeable nozzle station 17, and before the control device 41 of the component mounting machine reads the nozzle ID code of each suction nozzle 14 in each column of the nozzle station 17, the control device 41 thereof may cause the mark imaging camera 30 to image the station fiducial marks 47 of at least two positions provided on the nozzle station 17, recognize an image of the positions of the station fiducial marks 47 of at least two positions, and calculate the position of each suction nozzle 14 in each column of the nozzle station 17 based on positions of the station fiducial marks 47 of at least two positions. In this way, even if there is an inclination or an positional deviation of the nozzle station 17 installed in the component mounting machine, the position of each suction nozzle 14 of each column of the nozzle station 17 can be calculated with high accuracy based on the position of station fiducial marks 47 of at least two positions of the nozzle station 17, the nozzle ID code display section 54 of each suction nozzle 14 can be reliably imaged within the visual field of the mark imaging camera 30, and reading failure of the nozzle ID code due to the inclination or the positional deviation of the nozzle station 17 can be prevented.

In the embodiment described above, before the suction nozzle 14 held by the rotary head 15 is automatically exchanged, the nozzle ID codes of all the suction nozzles 14 arranged on the nozzle station 17 are continuously read at a high speed and stored in association with the position of each suction nozzle 14 and specifically an operation (so-called on-the-fly imaging) of sequentially imaging the nozzle ID code display section 54 of each suction nozzle 14 of each column is performed without stopping the mark imaging camera 30 while moving the mark imaging camera 30 in an arrangement direction of the suction nozzle 14 of each column of the nozzle station 17, the movement direction of the mark imaging camera 30 is reversed each time the last imaging operation of one column is completed and the mark imaging camera is moved to imaging operation of an adjacent column and the nozzle ID code of each suction nozzle 14 of each column read at the image processing operation is stored in the storage device 43 in association with the position of the suction nozzles 14, and thus the time required to recognize images of types of all the suction nozzles 14 arranged on the nozzle station 17 can be shortened and the multiple suction nozzles 14 held by the rotary head 15 can be continuously and efficiently exchanged.

The present invention may be configured that the nozzle station 17 cannot be exchanged, and even in this case, the desired object of the invention can be achieved.

Besides, the invention is not limited to the rotary head type component mounting machine described in the example, but can also be applied to a component mounting machine installed with a mounting head that is not rotated and, in addition, the number of suction nozzles 14 (number of nozzle holders 28) held by the rotary head 15 may be changed, the number of suction nozzles 14 arranged on the nozzle station 17 may be changed, or the arrangement pattern of the suction nozzles 14 of the nozzle station 17 may be changed, that is, it goes without saying that various modifications can be made within the scope not deviating from the gist.

REFERENCE SIGNS LIST

11 . . . circuit board, 12 . . . conveyor, 13 . . . component supply device, 14 . . . suction nozzle, 15 . . . rotary head, 16 . . . component imaging camera, 17 . . . nozzle station, 18 . . . nozzle accommodation recessed section, 20 . . . head moving mechanism, 21 . . . head rotating mechanism, 22 . . . Z-axis driving mechanism, 23 . . . nozzle rotating mechanism, 28 . . . nozzle holder, 30 . . . mark imaging camera, 41 . . . control device (control means), 43 . . . storage device (storage means), 46 . . . head fiducial mark, 47 . . . station fiducial mark, 50 . . . shutter plate, 52 . . . shutter plate driving mechanism, 53 . . . station ID code display section, 54 . . . nozzle ID code display section

The invention claimed is:

1. A component mounting machine, comprising:
a nozzle station in which multiple suction nozzles for exchanging with a suction nozzle held by a mounting head are arranged in multiple columns;
a camera configured to image a fiducial mark of a circuit board on which a component is mounted;
a nozzle ID code display section on an upper portion of each suction nozzle that displays a nozzle ID code which is a code of identification information of the suction nozzle; and
a control device configured to
control a nozzle exchange operation of moving the mounting head and the camera above the nozzle station and exchanging suction nozzles held by the mounting head with the suction nozzles of the nozzle station,
control an operation of imaging the nozzle ID code display section of each suction nozzle in each column of the nozzle station by the camera,
control an image processing operation of processing the image of the nozzle ID code display section imaged by the camera and reading the nozzle ID code,
perform an operation of sequentially imaging the nozzle ID code display section of each suction nozzle in each column without stopping movement of the camera along an arrangement direction of the suction nozzles of each column, reverse the movement direction of the camera each time the last imaging operation of one column is completed and the camera is moved for an imaging operation of an adjacent column, and store the nozzle ID code of each suction nozzle in each column read in the image processing operation in a storage device in association with a position of each suction nozzle,
store in the storage device a position of a suction nozzle whose nozzle ID code fails to be read during the operation of imaging the nozzle ID code display section of each suction nozzle,
complete the imaging of the nozzle ID code display sections of all the suction nozzles of the nozzle station after the storing the position of the suction nozzle whose nozzle ID code fails to be read, and
move the camera to above the suction nozzle whose nozzle ID code fails to be read based on stored information in the storage device, change an imaging condition, and repeat the imaging and image processing of the suction nozzle whose nozzle ID code fails to be read with the imaging condition.

2. The component mounting machine according to claim 1,
wherein the control device is configured to move the camera in a direction along a long side of the nozzle station as the arrangement direction of the suction nozzles in each column.

3. The component mounting machine according to claim 1,
wherein the control device moves the camera in an order of the suction nozzle closest to a current position of the camera among the suction nozzle whose nozzle ID code fails to be read and a second suction nozzle whose nozzle ID code fails to be read so as to perform imaging and image processing of the nozzle ID code display section of the suction nozzle again.

4. The component mounting machine according to claim 1,
wherein the control device stops the movement of the camera for the suction nozzle whose nozzle ID code fails to be read.

5. The component mounting machine according to claim 1,
wherein the control device changes lighting conditions of a light source in a for the suction nozzle whose nozzle ID code fails to be read.

6. The component mounting machine according to claim 1,
wherein the nozzle station is provided to be exchangeable and station fiducial marks are provided at at least two positions on an upper face side of the nozzle station, and
wherein the control device is configured to
control the camera to image the station fiducial marks,
recognize images of the positions of the station fiducial marks, and
calculate a position of each suction nozzle in each column of the nozzle station based on the positions of the station fiducial marks.

* * * * *